(12) United States Patent
Watanabe

(10) Patent No.: US 6,326,107 B1
(45) Date of Patent: Dec. 4, 2001

(54) PHASE SHIFT MASK AND PROCESS FOR MANUFACTURING THE SAME

(75) Inventor: Kunio Watanabe, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/501,572

(22) Filed: Feb. 10, 2000

(30) Foreign Application Priority Data

Mar. 19, 1999 (JP) .................................................. 11-075435

(51) Int. Cl.⁷ ................................. G03F 9/00; G03C 5/00
(52) U.S. Cl. ................................................. 430/5; 430/322
(58) Field of Search ............................... 430/5, 322, 324, 430/394

(56) References Cited

U.S. PATENT DOCUMENTS 5,536,604 * 7/1996 Ito ............................................ 430/5
5,945,237 * 8/1999 Tanabe ..................................... 430/5

FOREIGN PATENT DOCUMENTS 2-211450 A    8/1990  (JP) .

* cited by examiner

*Primary Examiner*—S. Rosasco
(74) *Attorney, Agent, or Firm*—Nixon & Vanderhye P.C.

(57) ABSTRACT

A phase-shifting mask includes a transparent substrate and a pattern formed of a translucent film on the transparent substrate. One of two regions of the substrate along both sidewalls of a trace of the pattern has a recess such that phases of exposure light passing through the two regions are 180° inverse to each other. The trace has different thicknesses on its sides adjacent to the two regions of the substrate so that phases of exposure light passing through the one region of the substrate and one side of the trace adjacent thereto are 180° inverse to each other and phases of exposure light passing through the other of the two regions of the substrate and the other side of the trace adjacent thereto are 180° inverse to each other.

5 Claims, 4 Drawing Sheets

Mask

Amplitude

Light-intensity

PHASE SHIFT MASK AND PROCESS FOR MANUFACTURING THE SAME

CROSS-REFERENCE TO RELATED APPLICATION

This application is related to Japanese Patent Application No. HEI 11(1999)-075435 filed on Mar. 19, 1999, whose priority is claimed under 35 USC §119, the disclosure of which is incorporated by reference in its entirety.

BACKGROUND OF THE INVENTION

1. Field of the Invention

The present invention relates to a phase-shifting mask and a process for manufacturing the same. More particularly, the invention relates to the structure of a phase-shifting mask which allows image formation of a pattern on a wafer at high resolution in manufacture of semiconductor devices and a manufacturing process of the same.

2. Description of Related Art

A conventional technique of phase-shifting masks is now explained in detail.

FIGS. 3(a) to 3(h) are schematic sectional views illustrating a process for producing a conventional-Levenson type phase-shifting mask (a mask having a section for shifting the phase of light emitted for exposure, referred to as "Levenson mask" hereinafter).

Referring to FIGS. 3(a) to 3(h), a blank mask 2 (a mask only of chromium without a pattern) used for producing a Levenson mask has a two-layered structure of a transparent substrate 1 and a light-tight film 3 formed thereon. Quartz is mainly used as a material for the transparent substrate 1 of the blank mask and chromium is mainly used as a material for the light-tight film 3. The chromium film used for the blank mask 2 is usually about 110 nm thick and is formed by a vacuum deposition method or by a sputtering method.

An electron-beam (EB) resist is mainly used as a material for a protective film required in processing from the blank mask 2 to the Levenson mask. The resist 4 is usually applied onto the blank mask 2 to a thickness of about 500 nm by a spin-on method (FIG. 3(a)). The resist film 4 is patterned by EB writing and development, thereby to form a resist mask. The light-tight film 3 is patterned by dry etching (FIG. 3(b)) using this resist mask.

After the light-tight film 3 is etched, the resist film 4 is removed (FIG. 3(c)).

After the removal of the resist film 4, the resulting blank mask is washed. The resist 4d is applied again to a thickness of about 500 nm. A conductive film 5 is then formed by application to a thickness of about 20 nm (FIG. 3(d)) and EB writing for alignment is conducted (FIG. 3(e)).

The resist film 4d in a recess region of the transparent substrate 1 is selectively removed by washing the conductive film 5 away with water and by development (FIG. 3(f)).

A recess 6 is formed in the transparent substrate 1 by etching to have such depth that the phase of exposure light passing through the recess 6 can be controlled to be inverted by 180 degrees with respect to the phase of exposure light passing through an adjacent transparent section of a pattern. (FIG. 3(g)).

The remaining resist film 4d is removed (FIG. 3(h)).

Through the above-mentioned process, completed is a phase-shifting mask wherein the recess 6 is formed in one of a pair of transparent sections of the pattern adjacent to a light-tight section 7, that is, a Levenson mask.

Next, the principle of the Levenson mask is explained.

FIGS. 4(a) to 4(c) illustrate the principle of the Levenson mask.

As shown in FIG. 4(a), the Levenson mask is provided with a shifter (a section which changes the phase of exposure light by 180 degrees) in one of a pair of regions where exposure light passes. In the case of FIG. 4(a), the shifter is the recess 6 in the transparent substrate 1. Light having passed a region c without a shifter and light having passed a region d with the shifter have the same intensity but their phases are shifted by 180 degrees. Waveforms of light from the light-passing regions have amplitudes in opposite directions at the feet of the waveforms where they overlap each other, and offset each other (FIG. 4(b)). As a result, there is a portion where the intensity of light becomes zero, and accordingly the resolution can be improved. Japanese Unexamined Patent Publication No. HEI 2(1990)-211450 discloses a Levenson type phase-shifting mask of a recess-in-transparent-substrate type having the above-described structure.

Fine patterning by photolithography is limited depending on wavelength of exposure light. However, a stepper (light-exposure device) providing a smaller wavelength of exposure light is far more expensive and requires troublesome preparation. Accordingly, the Levenson mask is used as inexpensive means for overcoming the limit of fine patterning with the wavelength of exposure light unchanged.

However, for performing further finer patterning with the wavelength of exposure light unchanged, the Levenson mask described here is not sufficient, and it is necessary to apply a novel photo mask allowing further enhancement of resolution.

SUMMARY OF THE INVENTION

The present invention provides a phase-shifting mask comprising a transparent substrate and a pattern formed of a translucent film on the transparent substrate, wherein one of two regions of the substrate along both sidewalls of a trace of the pattern has a recess such that phases of exposure light passing through the two regions are 180° inverse to each other, and the trace has different thicknesses on its sides adjacent to the two regions of the substrate so that phases of exposure light passing through said one region of the substrate and one side of the trace adjacent thereto are 180° inverse to each other and phases of exposure light passing through the other of the two regions of the substrate and the other side of the trace adjacent thereto are 180° inverse to each other.

To put that another way, the phase-shifting mask of the invention has a pattern of a translucent film on a transparent substrate. One of two substrate regions along both sidewalls of a trace of the pattern has a recess so that the phases of exposure light passing through the two substrate regions are 180° inverse to each other. The trace of the pattern has different thicknesses on its sides to the two substrate regions so that the phases of exposure light passing through said sides and the corresponding substrate regions are 180° inverse to each other between the corresponding region and side of the trace. Accordingly, the phases of exposure light passing through both the sides different in thickness are shifted 180° to those of light passing through the substrate regions adjacent thereto, and the amplitudes of passing exposure light are inverse to each other and offset at feet of amplitude curves where they overlap each other (see FIG. 1(b)). As a result, the resolution is further improved.

In the phase-shifting mask of the invention, the pattern of the translucent film is formed on the transparent substrate.

The two substrate (transparent substrate) regions along both sidewalls of the trace of the pattern in a sectional view perpendicular to a longitudinal direction of the trace of the pattern are traces of a transparent pattern.

One of the two substrate regions is dug to form a recess as a so-called "shifter" for inverting the phase of exposure light by 180°.

The depth C of the recess satisfies the following equation so that the phase of exposure light is 180° inverted:

$$C = \lambda/2(n1-1)$$

wherein $\lambda$ is wavelength of exposure light and n1 is refractive index of the translucent film.

On the other hand, one side of the trace of the pattern of the translucent film adjacent to said one substrate region where the recess is formed is constructed to have a thickness such that the phases of exposure light passing through said side of the translucent trace and said one substrate region are 180° inverse to each other. The other side of the translucent trace is constructed to have thickness such that the phases of exposure light passing through said other side of the translucent trace and the other one of the two substrate regions are 180° inverse to each other.

That is, the thickness a of said other side of the translucent trace adjacent to said other substrate region (see FIGS. 1(a) to 1(c), same in the following paragraphs) is set to $$a = \lambda/2(n1-1)$$

wherein $\lambda$ is wavelength of exposure light and n1 is refractive index of the translucent film, so that the phase of exposure light passing there is 180° different from that of exposure light passing through said other substrate region.

On the other hand, preferably, the thickness b of said one side of the translucent trace adjacent to said one substrate region where the recess is formed is set to $$b = 2a,$$

so that the phase of light passing there is 180° different from that of exposure light passing through said one substrate region.

Furthermore, the widths d, e of the trace of the translucent film are preferably set to satisfy $$f:g=h:i.$$

In the present invention, the translucent film preferably has a transmittance of 10% or less to exposure light. More particularly, it is preferable to use a metal such as silicide or chromium to which an appropriate amount of nitrogen or oxygen is added to elevate the transmittance and reduce the absorptivity coefficient (K). As suicides, usable are tungsten silicide (WSiON, adjusted with N or O), zirconium silicide (ZrSiON, adjusted with N or O), as well as molybdenum silicide, and chromeyl fluoride (CrFO, adjusted only with O) is usable.

In the present invention, the transparent substrate may be constructed of quartz, soda-lime glass, low-expansion glass or the like. Preferably, the transparent substrate is made of quarts which can provide transmittance of 90% or more to exposure light of a wavelength of 300 nm or less.

In another aspect, the present invention provides a process for manufacturing a phase-shifting mask comprising the steps of: forming a translucent film and a light-tight film on a transparent substrate in this order and subsequently forming a pattern of a resist film including a thick film portion and a thin film portion; etching two regions of the light-tight film along both sidewalls of a trace of the pattern of the resist film and at the same time etching an exposed translucent film, so as to form two substrate regions; removing the thin film portion of the resist film and etching the underlying light-tight film, etching an exposed translucent film shallowly so that the etched translucent film has a thickness such that the phases of exposure light passing through the etched translucent film and one of the substrate regions along a sidewall of the etched translucent film are 180° inverse to each other; forming a pattern of a resist film on the resulting transparent substrate and exposing the other of the substrate regions along another sidewall of the translucent film having a predetermined pattern; and etching said other substrate region to form a recess so that the phases of exposure light passing through said other substrate region and said one substrate region are 180° inverse to each other and the phases of exposure light passing through said other substrate region and an unetched portion of the trace of the pattern of the translucent film are 180° inverse to each other.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS (1) First, an operational principle of the phase-shifting mask in accordance with the present invention is described with reference to FIGS. 1(a) to 1(c).

The phase-shifting mask of the present invention is so constructed that light-tight traces of a pattern of the Levenson mask are formed of specific translucent films. In the Levenson mask, a recess is formed in one of a pair of transparent substrate regions adjacent to each other with intervention of a light-tight film, which are arranged in a region where exposure light passes, so that the phase of exposure light having passes through said one transparent substrate region is 180° inverse to the phase of exposure light having passed through the other transparent substrate region.

Figure 1:
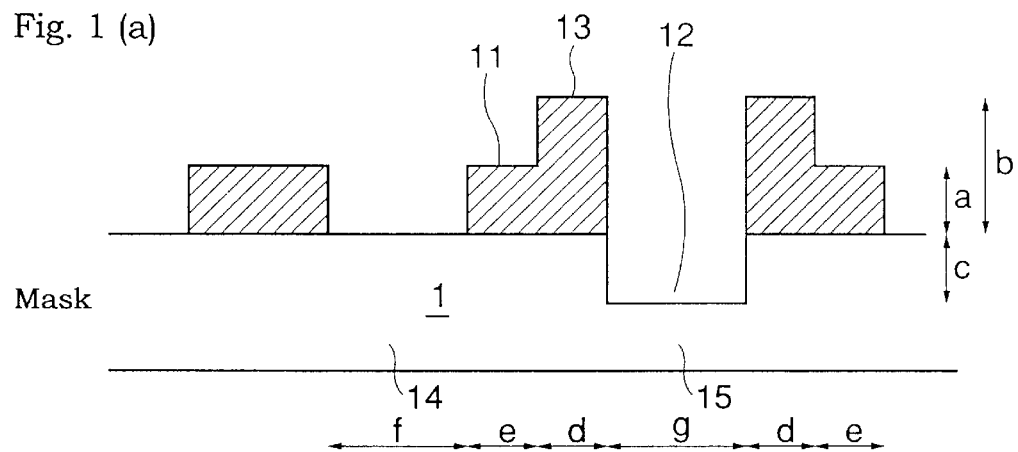
FIGS. 1(a) to 1(c) show the principle of a phase-shifting mask in accordance with the present invention.
Figure 1:
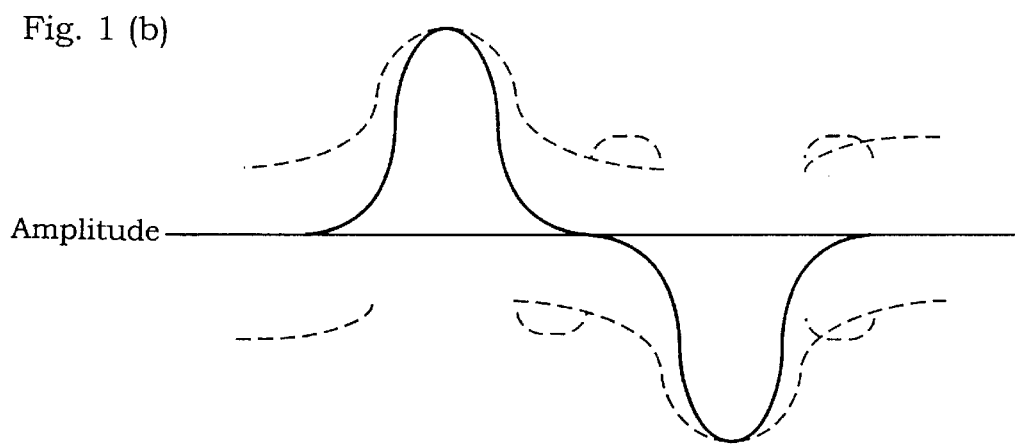
Figure 1:
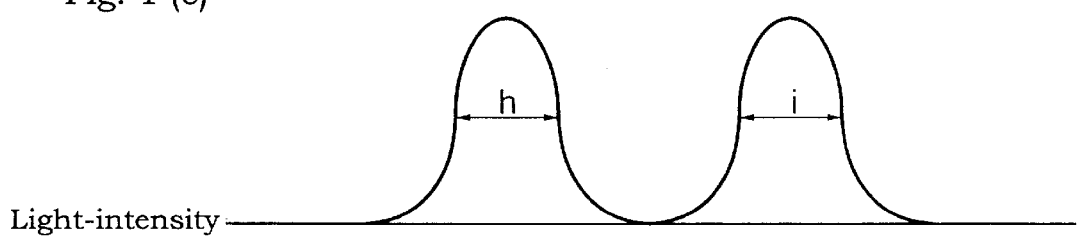
Figure 3:
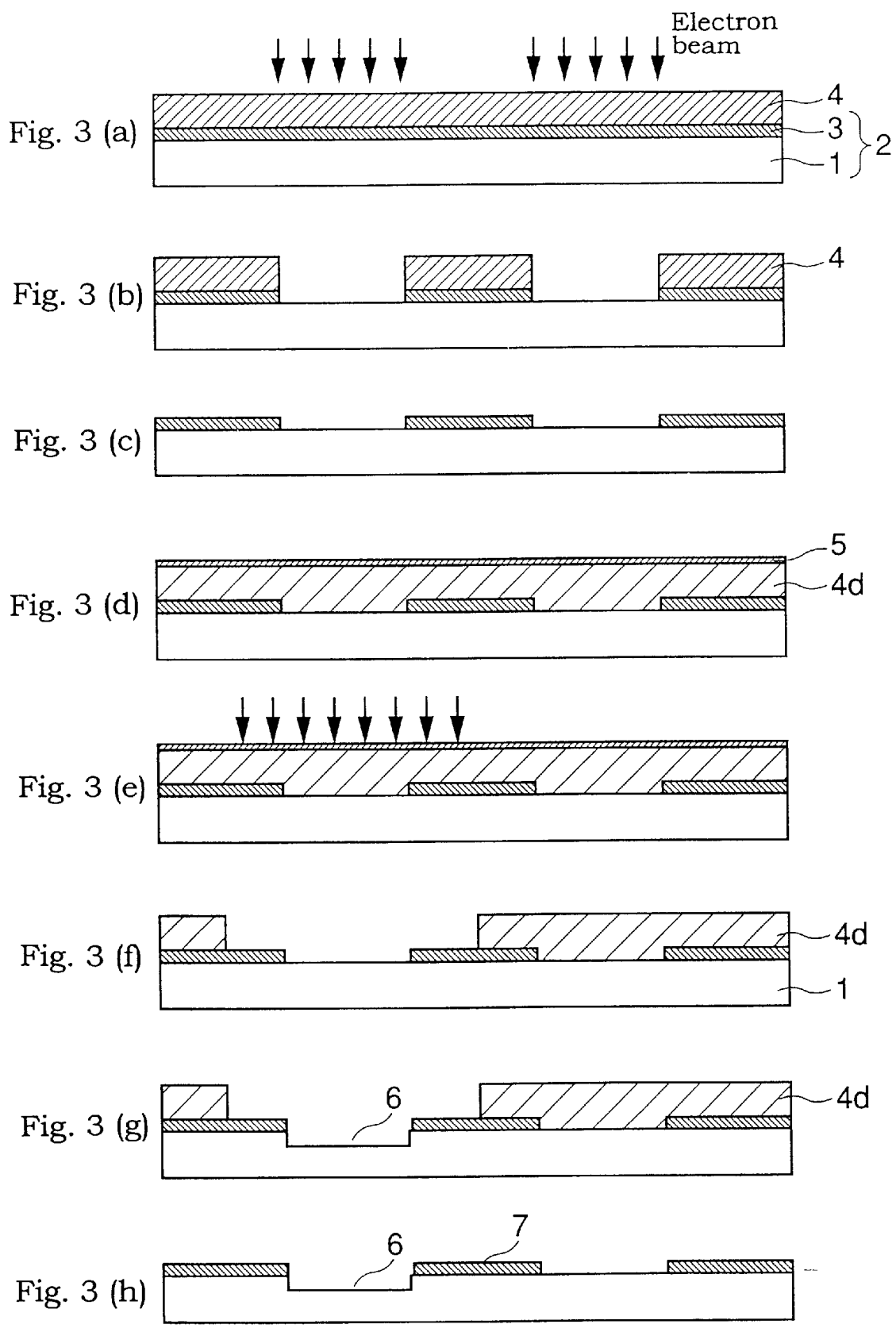
FIGS. 3(a) to 3(h) are schematic sectional views illustrating a process for manufacturing a conventional Levenson type phase-shifting mask.
Figure 4:
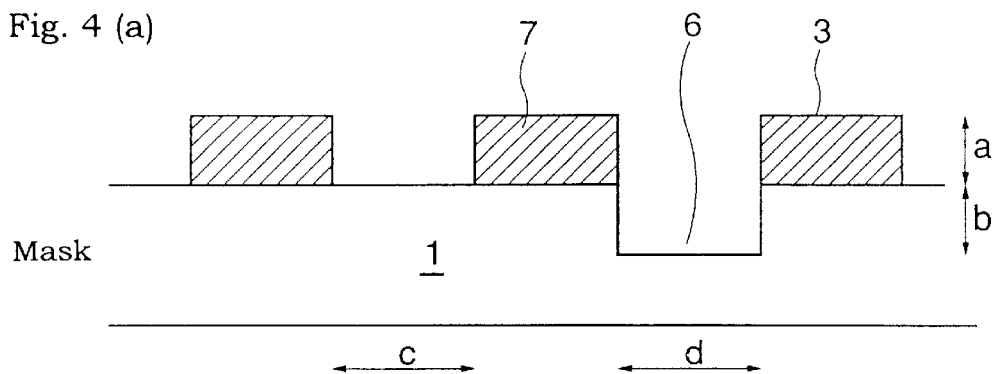
FIGS. 4(a) to 4(c) show the principle of the conventional Levenson type phase-shifting mask.
Figure 4:
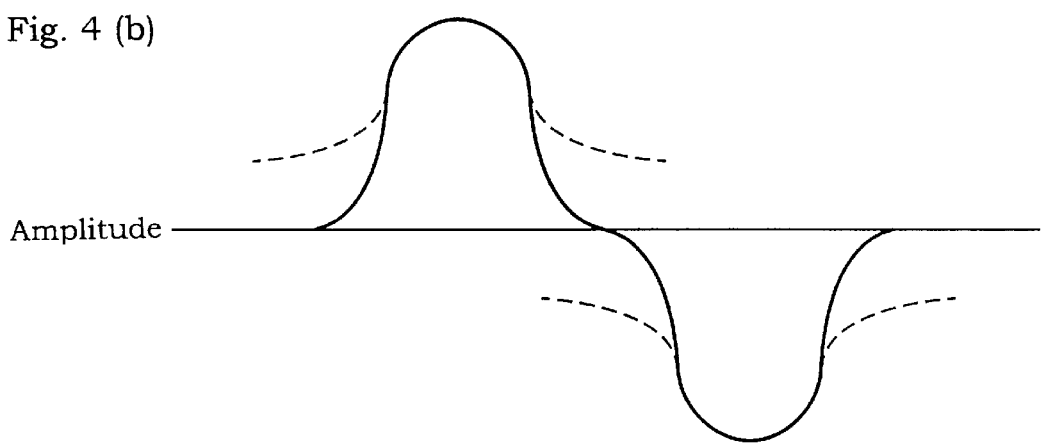
Figure 4:
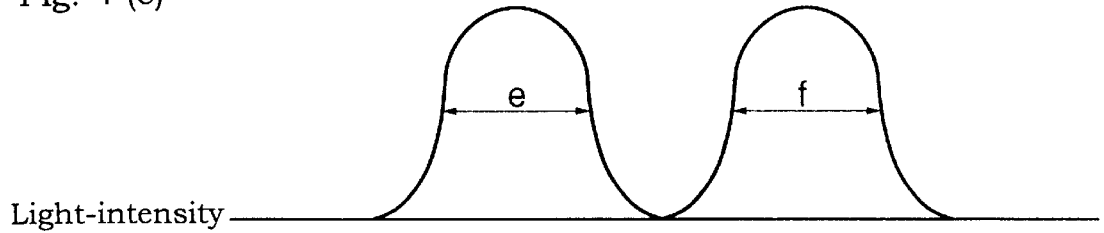

In other words, in the shifting mask of the present invention, a trace of the pattern formed of the light-tight film (denoted by numeral 7 in FIG. 3) of the Levenson mask which has a recess in one of two adjacent transparent substrate regions is changed into a translucent film of a two-stage structure including a thick portion (region) 13 and a thin portion (region) 11, as shown in FIG. 1. The phase of light in the thick portion 13 is shifted 180° with respect to that in the recess portion 12 of the transparent substrate 15 which is a shifter. The amplitudes of waves of light from the portions are opposite to and offset each other where the waves overlap each other. As a result, there is a portion where the intensity of light becomes zero, and it is possible to enhance the resolution further.

The phase of light at the thin portion 11 is shifted 180° with respect to the other transparent substrate region 14. The amplitudes of waves of light from the portions are opposite and cancels each other where the waves overlap each other. As a result, there is a portion where the intensity of light becomes zero, and it is possible to enhance the resolution further.

(2) The present invention is now described in detail by way of embodiments thereof shown in the figures.

FIGS. 2(a) to 2(h) are schematic sectional views illustrating a process for manufacturing a phase-shifting mask in accordance with one embodiment of the present invention.

Figure 2:
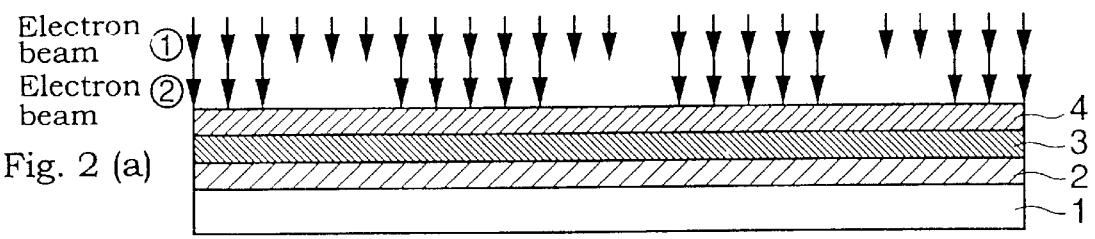
FIGS. 2(a) to 2(h) are schematic sectional views illustrating a process for manufacturing a phase-shifting mask in accordance with one embodiment of the present invention.
Figure 2:
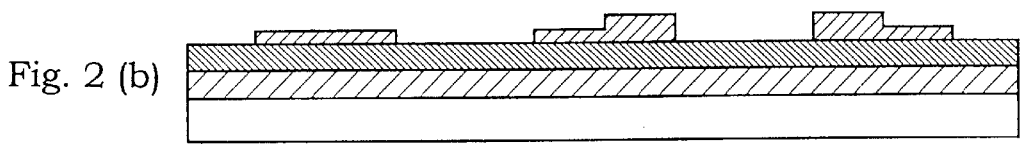
Figure 2:
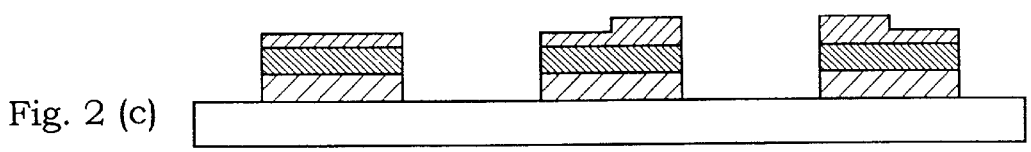
Figure 2:
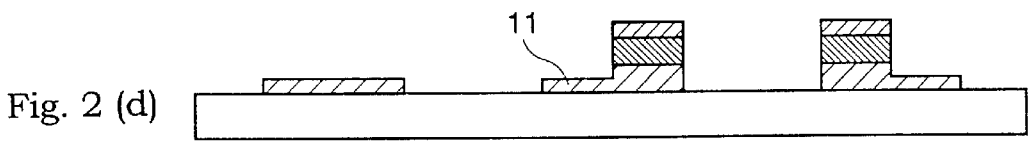
Figure 2:
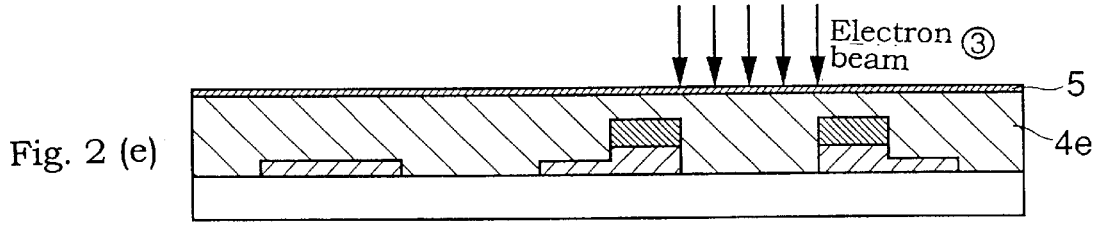
Figure 2:
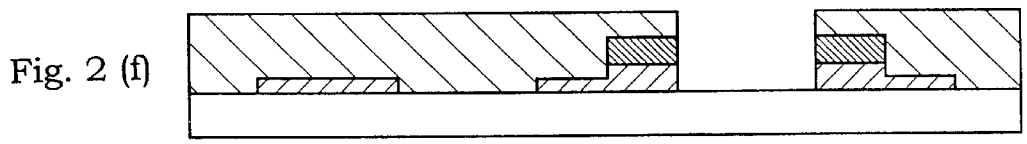
Figure 2:
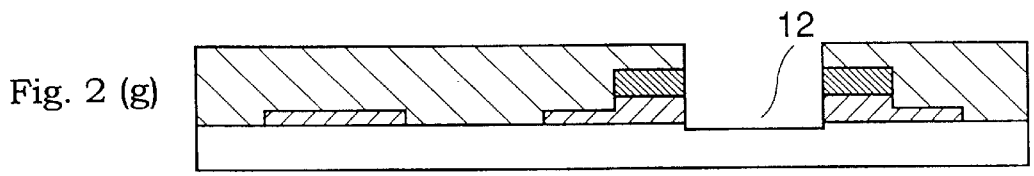
Figure 2:
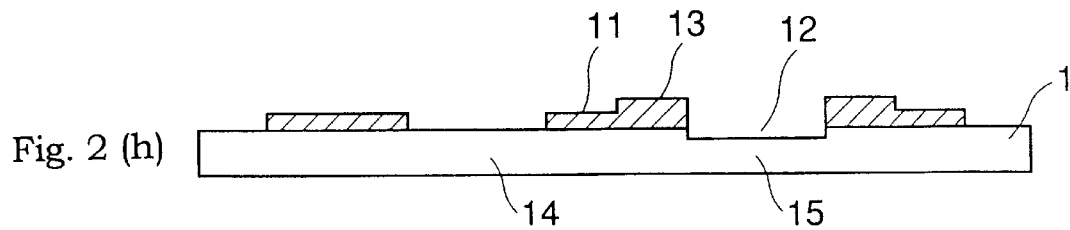

First, a translucent film 2 is formed on a transparent substrate 1 by sputtering or by vacuum deposition, a light-tight film 3 is formed thereon, and further a resist film 4 is formed by coating (FIG. 2(a)).

As the translucent film 2, used is a material which as a transmittance of 10% or less to exposure light (transmittance which does not cause a ghost pattern of photo resist) and is capable of inverting the phase of exposure light 180°, such as molybdenum silicide. As the light-tight film 3, used is a material whose transmittance to exposure light is 0.5% or less (capable of cutting off light completely) such as chromium. For the resist film 4, usually used is a material exhibiting a good etching resistance when the translucent film 2 and the light-tight film 3 are etched, such as polymethyl methacrylate (PMMA) for example.

The resist film is patterned into a thick resist film region, a thin resist film region and a non-resist region by a writing and a developing process (FIG. 2(b)).

In the writing process, a region where the phrase of exposure light passing the translucent film 2 is zero degree, i.e., the thick resist film region, is not written. A region where the phrase of exposure light passing the translucent film 2 is 180° inverted, i.e., the thin resist film region, is written once, and the thickness of the resist film in this region is such that pinholes are not formed in the resist film when the light-tight film 3 and the translucent film 2 are dry-etched or larger than such thickness, and equal to or smaller than a difference in level of the resist film between the thick resist film region and the thin resist film region. A transmissive region is irradiated with an electron beam whose charge amount is set to be enough for removing the resist film completely. The resist film 4 may be of positive type or of negative type. FIGS. 2(a) to 2(h) show a case where a positive-type resist is used. In the case of the positive-type resist, a portion not exposed to the electron beam remains as a resist pattern in the developing process and a portion exposed to the electron beam is dissolved in a developing liquid to expose the light-tight film 3 partially.

After development, the light-tight film 3 and the translucent film 2 are etched (FIG. 2(c)).

The exposed light-tight film 3 is first dry-etched. For dry etching, a parallel plate reactive ion etching (RIE) method is used. In the case where the light-tight film 3 is composed of a chromium film, $CCl_4$ (tetrachloromethane) and $O_2$ (oxygen), or $CH_2Cl_2$ (dichloromethane) and $O_2$ (oxygen) are used as etching gas at a flow rate of 25 sccm:75 sccm. RF power is 200 W (500 W or lower), pressure is 0.25 Torr (33.25 Pa), and discharge frequency is 13.56 MHz. In the case of the translucent film is composed of a molybdenum silicide film, the etching select ratio of the chromium film to the molybdenum silicide film is 30 or more, which is sufficient. The resist film 4 acts as a protective film against etching. Only part of the light-tight film 3 which is not covered with the resist film is removed and the translucent film 2 is partially exposed. In the case where a chlorine-containing gas is used for dry-etching the chromium, the resist film 4 exhibits a sufficient etching resistance.

Next, the exposed translucent film 2 is dry-etched. For this dry etching, used is a parallel plate reactive ion etching (RIE) method. In the case where the translucent film 2 is composed of a molybdenum silicide film, $CF_4$ (tetrafluoromethane), $O_2$ (oxygen) and $N_2$ are used as etching gas at a flow rate of 100 sccm:5 sccm:18 sccm. RF power is 100 W (500 W or lower), pressure is 0.015 Torr (2 Pa), discharge frequency is 13.56 MHz. In the case of the transparent substrate is composed of quartz, the etching select ratio of the molybdenum silicide film to the quartz substrate is 30 or more, which is sufficient. The resist film 4 acts as a protective film against etching. Only part of the translucent film 2 which is not covered with the resist film is removed and the transparent substrate 1 of quarts is partially exposed. In the case where tetrafluoromethane gas is used for dry-etching of the molybdenum silicide film, the resist film 4 exhibits a sufficient etching resistance.

By ashing the entire surface of the remaining resist film 4, the resist film 4 is removed from the thin resist film region and is maintained in a reduced thickness in the thick resist film region. The underlying light-tight film is dry-etched, and the exposed translucent film is dry-etched into a thin film portion 11 having a thickness such that the phase of exposure light passing through there can be controlled to be 180° inverted with respect to the phase of exposure light passing through the adjacent transparent substrate (FIG. 2(d)).

The remaining resist film 4 is removed, and a similar resist 4e is applied again in a thickness of about 500 nm. A conductive film 5 is applied in a thickness of about 20 nm, and EB writing for alignment is conducted (FIG. 2(e)).

By washing away the conductive film 5 with water and development, the resist film 4e in a recess portion-to be 12 on the transparent substrate is selectively removed (FIG. 2(f)).

The exposed surface of the transparent substrate is etched to form a recess 12 having a depth such that the phase of exposure light passing through the recess 12 can be controlled to be 180° inverted with respected to the phase of exposure light passing through the adjacent translucent film 13 (FIG. 2(g)).

The remaining resist film 4e is removed and thereafter the remaining light-tight film 3 is removed (FIG. 2(h)).

Thus the resolution of the conventional Levenson mask can further be improved by the phase-shifting mask of the invention in which the translucent film composed of the thin film portion 11 and the thick film portion 13 is formed on the transparent substrate 1 and the recess 12 is formed in the transparent substrate adjacent to the thick film portion in the above-described manner.

According to the present invention, since the two-stage translucent film (including the thick film portion and the thin film portion) is used in place of the light-tight pattern of the Levenson mask. Therefore, it is possible to obtain a photoresist configuration exhibiting a higher resolution than the conventional Levenson mask by a phase-shifting effect of the translucent film.

What is claimed is:

1. A phase-shifting mask comprising:

a transparent substrate, and a trace pattern formed on the transparent substrate from a translucent film, wherein a first region of the substrate has a recess in the substrate and a first side of the trace adjacent to the substrate recess, the first side of the trace having a first thickness such that the phases of exposure light passing through the first side of the trace and the substrate recess are 180° inverse to each other, and wherein a second region of the substrate does not have a recess and has a second side of the trace adjacent thereto, the second side of the trace having a second thickness such that the phases of exposure light passing through the second side of the trace and the second substrate region are 180° inverse to each other, the second thickness being less than the first thickness.

2. A phase-shifting mask according to claim 1, wherein the first side of the trace adjacent to the first region of the substrate having the recess is twice as thick as the second side of the trace adjacent to the second region of the substrate not having a recess.

3. A phase-shifting mask according to claim 1, wherein the translucent film is formed of a film whose transmittance to exposure light is 10% or lower.

4. A phase-shifting mask according to claim 1, wherein the translucent film is a film of silicide or chromium containing nitrogen or oxygen.

5. A process for manufacturing a phase-shifting mask comprising the steps of:

forming a translucent film and a light-tight film on a transparent substrate in this order and subsequently forming a pattern of a resist film including a thick film portion and a thin film portion;

etching two regions of the light-tight film along both sidewalls of a trace of the pattern of the resist film and at the same time etching an exposed translucent film, so as to form first and second substrate regions;

removing the thin film portion of the resist film and etching the underlying light-tight film, etching a first portion of an exposed translucent film shallowly so that the etched translucent film has a first thickness such that the phases of exposure light passing through the etched first portion of translucent film and the first substrate region along a first sidewall of the etched first portion of translucent film are 180° inverse to each other;

forming a pattern of a resist film on the resulting transparent substrate and exposing the second substrate region along a second sidewall of a second unetched portion of the translucent film having a predetermined pattern; and etching the second substrate region to form a recess in the second substrate region so that the phases of exposure light passing through the second substrate region and the first substrate region are 180° inverse to each other, and the phases of exposure light passing through the second substrate region and the second unetched portion of the trace of the pattern of the translucent film are 180° inverse to each other, the second portion of translucent film having a second thickness less than the first thickness of the first portion of translucent film.

* * * * *